United States Patent
Kim et al.

(10) Patent No.: US 9,109,298 B2
(45) Date of Patent: Aug. 18, 2015

(54) CRYSTAL GROWING ORNAMENT

(75) Inventors: Hak-Jae Kim, Daejeon (KR); Han-Shin Jung, Daejeon (KR)

(73) Assignee: DONG-A TEACHING MATERIALS CO., LTD., Daejeon (KR)

(*) Notice: Subject to any disclaimer, the term of this patent is extended or adjusted under 35 U.S.C. 154(b) by 840 days.

(21) Appl. No.: 13/396,163

(22) Filed: Feb. 14, 2012

(65) Prior Publication Data

US 2012/0237413 A1 Sep. 20, 2012

(30) Foreign Application Priority Data

Mar. 18, 2011 (KR) .................. 10-2011-0024101

(51) Int. Cl.
- C30B 7/02 (2006.01)
- C30B 29/54 (2006.01)
- A63H 3/00 (2006.01)
- A63H 9/00 (2006.01)
- B44C 5/00 (2006.01)

(52) U.S. Cl.
CPC .. C30B 7/02 (2013.01); A63H 3/00 (2013.01); A63H 9/00 (2013.01); B44C 5/00 (2013.01); C30B 29/54 (2013.01)

(58) Field of Classification Search
CPC ....................................................... C30B 7/02
See application file for complete search history.

(56) References Cited

U.S. PATENT DOCUMENTS 7,228,125 B2 * 6/2007 Adachi et al. ............. 455/414.2
2003/0064177 A1 4/2003 Sawyer

FOREIGN PATENT DOCUMENTS

JP 10-58899 3/1998
KR 2002-0076873 10/2002

OTHER PUBLICATIONS

Dr. Skip, OSU COllege of Enginerring "An Amazing Crystal Garden and so easy to make" Jun. 2004, http://engineering.oregonstate.edu/momentum/k12/june04.*

* cited by examiner

Primary Examiner — Robert M Kunemund
(74) Attorney, Agent, or Firm — Lex IP Meister, PLLC

(57) ABSTRACT

Provided is a new-concept crystal growing ornament that may change in size due to a recrystallization phenomenon by supplying a growth liquid, thereby reducing repugnance or an artificial impression and arousing curiosity or interest. The crystal growing ornament includes a basic material made of a porous material and formed in a predetermined shape; a growth liquid formed to be absorbed into the basic material and evaporating after being absorbed into the basic material to generate a recrystallization phenomenon; a growth liquid supply unit connected to the basic material and formed to supply the growth liquid to the basic material after receiving the growth liquid; and a crystal growing body integrally formed outside the basic material due to the recrystallization phenomenon of the growth liquid.

6 Claims, 3 Drawing Sheets

CRYSTAL GROWING ORNAMENT

CROSS-REFERENCE TO RELATED APPLICATION

This application claims priority to and the benefit of Korean Patent Application No. 10-2011-0024101 filed in the Korean Intellectual Property Office on Mar. 18, 2011, the entire contents of which are incorporated herein by reference.

BACKGROUND OF THE INVENTION (a) Field of the Invention

The present invention relates to a crystal growing ornament, and more particularly, to a crystal growing ornament configured to provide a new-concept ornament that may change in size due to a recrystallization phenomenon occurring by supplying a growth liquid, unlike an existing ornament of which a size or the like is not especially easily changed.

(b) Description of the Related Art

In general, there are a lot of different kinds of ornaments for decorating the interior, the exterior, and the like.

All kinds of articles, which are widely used in everyday life, may become ornaments when used for the purpose of decoration. For example, a pottery may be used as a bowl and for decorative purposes at the same time.

The ornament may be living things such as a flower and a tree and also be nonliving things such as a pottery-shaped ornament and an animal-shaped ornament.

Meanwhile, since an ornament embodying living things such as a bear shape or a frog shape is made of a synthetic resin, metal, or wood, it is difficult to expect a change such as growth, which gives an artificial impression to a user and may make the user tired of the ornament often.

Therefore, if an ornament having an animal shape or a plant shape as non-living things not living things is artificially changed in size, color, or the like, it is expected to prevent a user from being tired of the ornament, provide new decorative beauty, and arouse interest and curiosity of users such as children.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide a crystal growing ornament having advantages of preventing a user from being tired of the ornament, providing new decorative beauty, and arousing interest and curiosity of users such as children, since the ornament grows as a crystal growing body gradually becomes larger due to a recrystallization phenomenon occurring by supplying a growth liquid to the surface of a basic material made of a porous material.

An exemplary embodiment of the present invention provides a crystal growing ornament, including: a basic material made of a porous material and formed in a predetermined shape; a growth liquid formed to be absorbed into the basic material and evaporating after being absorbed into the basic material to generate a recrystallization phenomenon; a growth liquid supply unit connected to the basic material and formed to supply the growth liquid to the basic material after receiving the growth liquid; and a crystal growing body integrally formed outside the basic material by the recrystallization phenomenon of the growth liquid.

The growth liquid may include a solvent, a crystalline material, and a coloring agent.

The growth liquid may further include an aromatic.

The crystal growing ornament may further include a support portion formed to support the basic material.

The growth liquid supply unit may be integrally formed with the support portion.

According to the exemplary embodiment of the present invention, since the crystal growing ornament may change in size by forming a crystal growing body due to a recrystallization phenomenon on the surface of the basic material unlike an existing ornament, it is possible to provide a new-concept ornament, prevent a user from being tired of the ornament, and arouse curiosity and interest of users such as children.

Further, according to the exemplary embodiment of the present invention, since the crystal growing ornament includes the aromatic in the growth liquid, when being configured as a flower-shaped ornament, the crystal growing ornament may emit a fragrance and thus may be realistically manufactured and may also serve as an air freshener.

Moreover, according to the exemplary embodiment of the present invention, since the crystal growing ornament may display various colors depending on the coloring agent included in the growth liquid and may supply the growth liquid including suitable colors for each part, it is possible to provide ornaments with various designs.

DETAILED DESCRIPTION OF THE EMBODIMENTS

Hereinafter, exemplary embodiments of a crystal growing ornament according to the present invention will be described with reference to the accompanying drawings.

Figure 1:
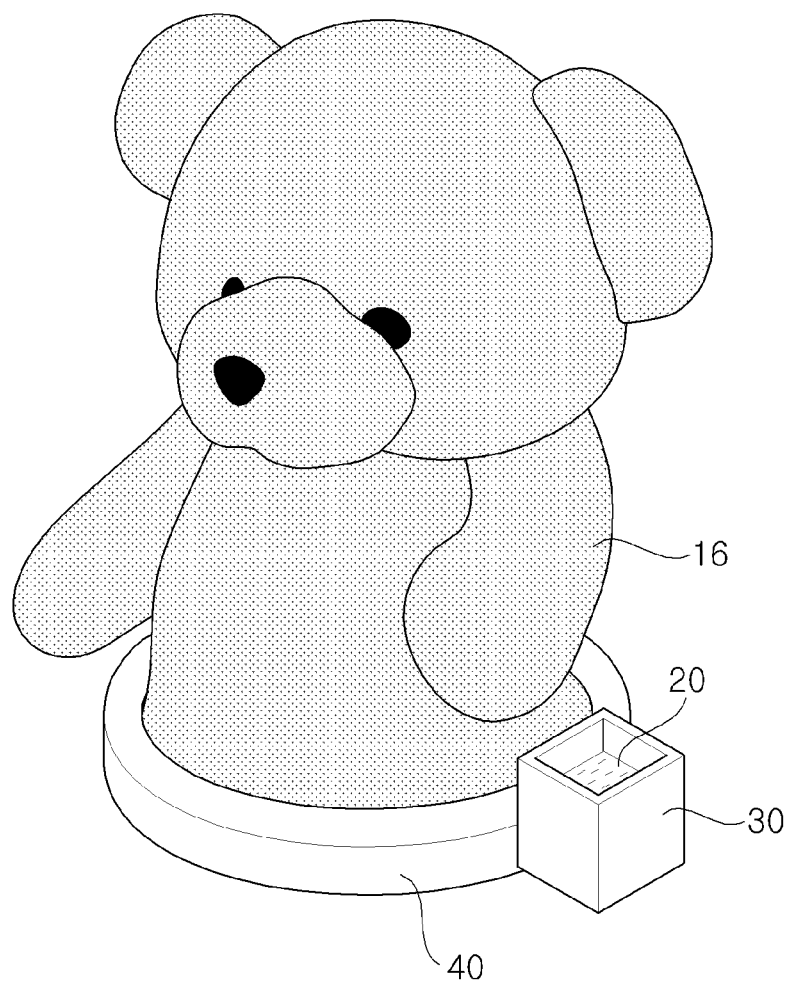
FIG. 1 is a perspective view showing a crystal growing ornament according to an exemplary embodiment of the present invention.
Figure 2:
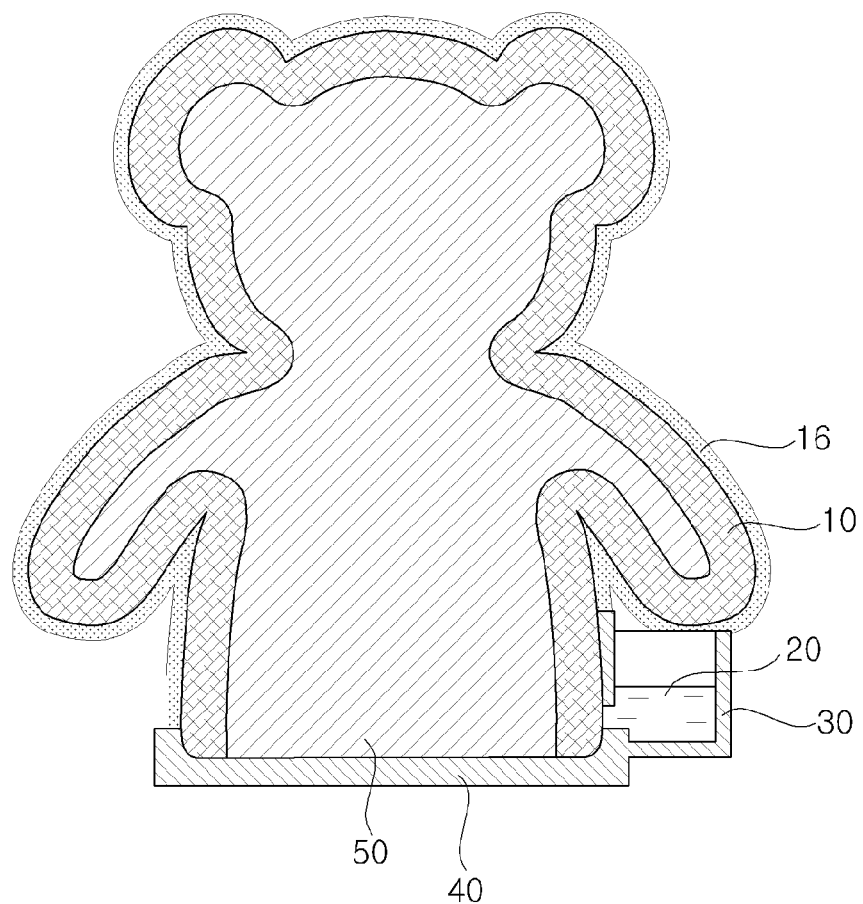
FIG. 2 is a front view showing a crystal growing ornament according to an exemplary embodiment of the present invention.

First, as shown in FIGS. 1 and 2, a crystal growing ornament according to an exemplary embodiment of the present invention includes a basic material 10 formed in a predetermined shape, a growth liquid 20 which is absorbed into the basic material 10 and then is in contact with an external air to generate a recrystallization phenomenon, a growth liquid supply unit 30 installed at one side of the basic material 10, and a crystal growing body 16 integrally formed outside of the basic material 10 by the recrystallization phenomenon of the growth liquid 20.

The basic material 10 is made by using a porous material or the like so as to absorb the growth liquid 20. For example, the basic material 10 is made by using a fiber aggregate, a sponge, a foam resin, foam rubber or the like.

The basic material 10 is formed in a wide variety of shapes. For example, the basic material 10 is formed in an animal shape such as a bear.

The basic material 10 may be formed in a plant shape such as a flower or a tree, a sculpture shape, a production shape, and the like in addition to the animal shape.

A support portion 40 may be further formed at lower part of the basic material 10.

The support portion 40 is made by using a synthetic resin, metal, glass, and the like so as to prevent the growth liquid 30 from being absorbed and is formed so as to support the basic material 10.

Figure 3:
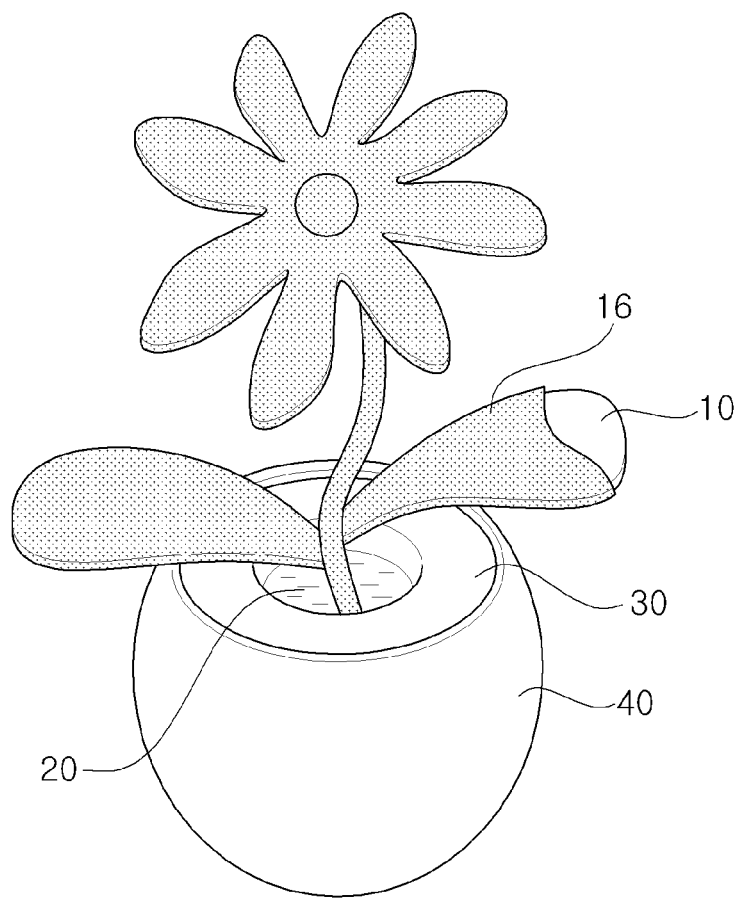
FIG. 3 is a perspective view showing a crystal growing ornament according to another exemplary embodiment of the present invention.

As shown in FIG. 2, the support portion 40 is supported on the bottom while surrounding a lower end part of the basic material 10 or is formed of a type such as a support so as to fix and support the lower end part of the basic material 10, as shown in FIG. 3.

The growth liquid 20 includes a solvent, a crystalline material, and a coloring agent.

For example, the growth liquid 20 includes approximately 20 to 75 wt % of a solvent, 20 to 50 wt % of a crystalline material, and 0.1 to 30 wt % of a coloring agent.

As the solvent, water or lower alcohol is used or two solvents are used in combination.

As the lower alcohol, one or more selected from a group consisting of methyl alcohol, ethyl alcohol, and propyl alcohol are used.

As the crystalline material, urea is used.

As the coloring agent, a colored dye or a colored pigment is used.

The growth liquid 20 may further include an aromatic.

The aromatic may be added at approximately 0.1 to 5 wt %.

Further, one or more selected from an antiseptic, a wetting agent, and a surfactant may be added to the growth liquid 20.

The growth liquid supply unit 30 is connected to the basic material 10 and is formed so that the growth liquid 20 is received therein temporarily or for a long time and then is absorbed into the basic material 10.

For example, the growth liquid supply unit 30 is formed substantially in a tub shape, as shown in FIG. 2, is connected to one side of a lower part of the basic material 10, and is formed so that the growth liquid 20 is absorbed into the basic material 10.

Although not shown in the figure, two or more growth liquid supply units 30 may be installed at various positions of the basic material 10.

When two or more growth liquid supply units 30 are installed, the growth liquid 20 can be supplied to many parts of the basic material 10 in a short time under simultaneous multiple supply and different colored growth liquids 20 can be supplied to respective parts of the basic material 10, such that it is possible to form a crystal growing body 16 having different colors for each part.

As another example, the growth liquid supply unit 30, as shown in FIG. 3, may be connected to a lower part of the basic material 10 and formed so that the growth liquid 30 is received along a periphery of the lower part of the basic material 10.

The growth liquid supply unit 30 may also serve as the support portion 40.

In the crystal growing ornament according to the exemplary embodiment of the present invention configured as described above, a pad portion 50 may be additionally formed inside the basic material 10, as shown in FIG. 2.

The pad portion 50 is made by using a synthetic resin, metal, glass, or the like so as to prevent the growth liquid 20 from being absorbed and is formed substantially in a shape corresponding to the shape of the basic material 10.

Although not shown in the figure, a part receiving the growth liquid 20 of the growth liquid supply unit 30 and the basic material 10 may be connected by using a wick.

The wick is formed so that an outside thereof is surrounded by a vinyl cover or the like and the growth liquid 20 starts to be absorbed from one end part of the wick and is absorbed up to the opposite side thereof by a capillary phenomenon.

The wick may be installed in plural.

That is, if a plurality of wicks are installed with one end parts positioned at parts receiving the growth liquid 20 and with the other end parts uniformly distributed as a whole at many parts of the basic material 10, the growth liquid 20 is uniformly supplied to the whole basic material 10 simultaneously and it is possible to cause a recrystallization phenomenon while the growth liquid 20 is absorbed.

Next, an operation process of the crystal growing ornament according to the exemplary embodiment of the present invention will be described with reference to the accompanying drawings.

First, the growth liquid 20 causing the recrystallization phenomenon may be manufactured by the following method of manufacturing a growth liquid.

<Method of Manufacturing Growth Liquid>

53.9 wt % of water as a solvent, 45 wt % of urea as a crystalline material, 1.0 wt % of C.I Acid Red 87 as a dye, and 0.1 wt % of antiseptic were mixed at room temperature for 1 hour to obtain a red growth liquid.

The manufactured growth liquid 20 as described above was supplied to the growth liquid supply unit 30 at a certain amount (see FIG. 2).

When the growth liquid 20 supplied to the growth liquid supply unit 30 was absorbed into the basic material 10 and approximately 10 to 30 seconds after the absorption passed, the solvent contained in the growth liquid 20 evaporated and a recrystallization phenomenon in which the dissolved crystalline material is produced again occurred on the surface of the basic material 10, thereby forming the crystal growing body 16 (see FIGS. 1 to 3).

After the crystal growing body 16 is formed and a predetermined time passes, when the growth liquid 20 is supplied to the growth liquid supply unit 30 again, a new crystal growing body 16 is produced between the surface of the basic material 10 and the previously formed crystal growing body 16 or the previously formed crystal growing body 16 may absorb the growth liquid 20 to grow more.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

DESCRIPTION OF SYMBOLS

| 10: Basic material | 16: Crystal growing body |
|---|---|
| 20: Growth liquid | 30: Growth liquid supply unit |
| 40: Support portion | 50: Pad portion |

What is claimed is:

1. A crystal growing ornament, comprising:
a basic material made of a porous material and formed in a predetermined shape;
a growth liquid formed to be absorbed into the basic material and evaporating after being absorbed into the basic material to generate a recrystallization phenomenon;
a growth liquid supply unit connected to the basic material and formed to supply the growth liquid to the basic material after receiving the growth liquid; and a crystal growing body integrally formed outside the basic material by the recrystallization phenomenon of the growth liquid,
wherein the growth liquid includes 20 to 75 wt % of a solvent, 20 to 50 wt % of urea, and 0.1 to 30 wt % of a coloring agent.

2. The crystal growing ornament of claim 1, further comprising:
a support portion formed to support the basic material.

3. The crystal growing ornament of claim 2, wherein:
the growth liquid supply unit is integrally formed with the support portion.

4. The crystal growing ornament of claim 1, wherein:
the growth liquid further includes 0.1 to 5 wt % of an aromatic.

5. The crystal growing ornament of claim 2, wherein:
the growth liquid further includes 0.1 to 5 wt % of an aromatic.

6. The crystal growing ornament of claim 3, wherein:
the growth liquid further includes 0.1 to 5 wt % of an aromatic.

\* \* \* \* \*